United States Patent
Thiruvengadam et al.

(10) Patent No.: US 11,836,078 B2
(45) Date of Patent: *Dec. 5, 2023

(54) TRIM SETTING DETERMINATION ON A MEMORY DEVICE

(71) Applicant: Micron Technology, Inc., Boise, ID (US)

(72) Inventors: Aswin Thiruvengadam, Folsom, CA (US); Daniel L Lowrance, El Dorado Hills, CA (US); Peter Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/575,998

(22) Filed: Jan. 14, 2022

(65) Prior Publication Data

US 2022/0138100 A1 May 5, 2022

Related U.S. Application Data

(63) Continuation of application No. 17/007,117, filed on Aug. 31, 2020, now Pat. No. 11,226,896, which is a (Continued)

(51) Int. Cl.
*G06F 12/02* (2006.01)
*G11C 11/406* (2006.01)
(Continued)

(52) U.S. Cl.
CPC ...... *G06F 12/0292* (2013.01); *G06F 12/0246* (2013.01); *G06F 13/1694* (2013.01);
(Continued)

(58) Field of Classification Search
None
See application file for complete search history.

(56) References Cited

U.S. PATENT DOCUMENTS 3,873,286 A 3/1975 Wurtenberg
8,804,428 B2 8/2014 Marquart
(Continued)

FOREIGN PATENT DOCUMENTS

CN 104011800 A 8/2014
EP 3704702 A1 9/2020
(Continued)

OTHER PUBLICATIONS

First Office Action from related Chinese patent application No. 201880071382.3 dated Feb. 7, 2021, 19 pages.
(Continued)

*Primary Examiner* — Tan T. Nguyen
(74) *Attorney, Agent, or Firm* — Brooks, Cameron & Huebsch, PLLC

(57) ABSTRACT

The present disclosure includes apparatuses and methods related to determining trim settings on a memory device. An example apparatus can determine a set of trim settings for the array of memory cells based on the operational characteristics of the array of memory cells, wherein the set of trim settings are associated with desired operational characteristics for the array of memory cells.

20 Claims, 3 Drawing Sheets

Related U.S. Application Data continuation of application No. 16/442,792, filed on Jun. 17, 2019, now Pat. No. 10,761,980, which is a continuation of application No. 15/802,652, filed on Nov. 3, 2017, now Pat. No. 10,324,839.

(51) Int. Cl.

| | | |
|---|---|---|
| *G11C 16/20* | (2006.01) | |
| *G11C 16/34* | (2006.01) | |
| *G06F 13/16* | (2006.01) | |
| *G11C 16/32* | (2006.01) | |
| *G06F 16/18* | (2019.01) | |
| *G11C 7/20* | (2006.01) | |
| *G11C 29/02* | (2006.01) | |
| *G11C 29/44* | (2006.01) | |

(52) U.S. Cl.
CPC ............ *G06F 16/1847* (2019.01); *G11C 7/20* (2013.01); *G11C 11/40607* (2013.01); *G11C 16/20* (2013.01); *G11C 16/32* (2013.01); *G11C 16/3459* (2013.01); *G11C 29/028* (2013.01); *G06F 2212/7208* (2013.01); *G06F 2212/7209* (2013.01); *G11C 2029/4402* (2013.01); *G11C 2211/5641* (2013.01)

(56) References Cited

U.S. PATENT DOCUMENTS

| | | | |
|---|---|---|---|
| 9,251,891 B1* | 2/2016 | Hu | G11C 16/26 |
| 9,324,441 B1 | 4/2016 | Shah | |
| 10,324,839 B2 | 6/2019 | Thiruvengadam | |
| 10,600,496 B1 | 3/2020 | Wieduwilt | |
| 10,761,980 B2 | 9/2020 | Thiruvengadam | |
| 11,226,896 B2* | 1/2022 | Thiruvengadam | G06F 12/0292 |
| 2006/0015691 A1 | 1/2006 | Louie | |
| 2007/0223278 A1 | 9/2007 | Aritome | |
| 2008/0253191 A1 | 10/2008 | Kang | |
| 2009/0010066 A1 | 1/2009 | Kim | |
| 2009/0316486 A1 | 12/2009 | Anitome | |
| 2011/0167206 A1 | 7/2011 | Bovino | |
| 2012/0182803 A1 | 7/2012 | Shirakawa | |
| 2012/0230109 A1 | 9/2012 | Tsai et al. | |
| 2013/0044546 A1 | 2/2013 | Marquart | |
| 2013/0275660 A1 | 10/2013 | Bennett | |
| 2014/0160869 A1 | 6/2014 | He et al. | |
| 2014/0241097 A1 | 8/2014 | Hawes | |
| 2014/0260508 A1 | 9/2014 | Dar | |
| 2015/0092469 A1 | 4/2015 | Kim et al. | |
| 2015/0234603 A1 | 8/2015 | Kitagawa et al. | |
| 2015/0324148 A1 | 11/2015 | Achtenberg | |
| 2016/0099057 A1* | 4/2016 | Dusija | G11C 16/3459 365/185.11 |
| 2016/0117112 A1 | 4/2016 | Tomlin | |
| 2016/0179406 A1 | 6/2016 | Gorobets | |
| 2016/0179407 A1 | 6/2016 | Gorobets et al. | |
| 2016/0180953 A1 | 6/2016 | Darragh | |
| 2016/0217858 A1 | 7/2016 | Navon et al. | |
| 2016/0225446 A1* | 8/2016 | Khwa | G11C 13/0064 |
| 2017/0160989 A1 | 6/2017 | Hsieh et al. | |
| 2018/0074708 A1 | 3/2018 | Gerhart | |
| 2019/0139619 A1* | 5/2019 | Thiruvengadam | G06F 12/0292 |
| 2020/0395091 A1 | 12/2020 | Thiruvengadam | |
| 2021/0042200 A1 | 2/2021 | Xie | |
| 2021/0286722 A1* | 9/2021 | Thiruvengadam | G11C 16/32 |

FOREIGN PATENT DOCUMENTS

| | | |
|---|---|---|
| EP | 3704703 A1 | 9/2020 |
| WO | 2016036720 A1 | 3/2016 |

OTHER PUBLICATIONS

Extended European Search Report and Opinion from related international application No. PCT/US2018058882 dated Oct. 5, 2021, 16 pages.
Second Office Action from related Chinese application No. 201880071382.3, dated Nov. 9, 2021, 17 pages.
Communication pursuant to Rule 164(1) EPC from related international application No. PCT/US2018058882 dated Jun. 29, 2021, 17 pages.
International Search Report and Written Opinion from related international Application No. PCT/US2018/058882, dated Feb. 20, 2019, 16 pages.

* cited by examiner

TRIM SETTING DETERMINATION ON A MEMORY DEVICE

PRIORITY INFORMATION

This application is a Continuation of U.S. application Ser. No. 17/007,117, filed on Aug. 31, 2020, which is a Continuation of U.S. application Ser. No. 16/442,792, filed on Jun. 17, 2019, which was issued U.S. Pat. No. 10,761,980 on Sep. 1, 2020, which is a Continuation of U.S. application Ser. No. 15/802,652 filed on Nov. 3, 2017, which was issued U.S. Pat. No. 10,324,839 on Jun. 18, 2019, the contents of which are incorporated herein by reference in its entirety.

TECHNICAL FIELD

The present disclosure relates generally to memory systems, and more particularly, to apparatuses and methods to determine trim settings on a memory device.

BACKGROUND

Memory devices are typically provided as internal, semiconductor, integrated circuits in computing devices or other electronic devices. There are many different types of memory including volatile and non-volatile memory. Volatile memory can require power to maintain its data (e.g., user data, error data, etc.) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

A memory system can include a cache memory that may be smaller and/or faster than other memory of the system (e.g., DRAM, NAND, disk storage, solid state drives (SSD), etc., which may be referred to as main memory). As an example, cache memory may comprise DRAM memory. A memory system can cache data to improve performance of the memory system. Therefore providing cache memory that delivers improved performance for the memory system is desirable. Improving the latency and hit rate of the cache memory are performance characteristics that can provide improved performance of the memory system.

DETAILED DESCRIPTION

Figure 1:
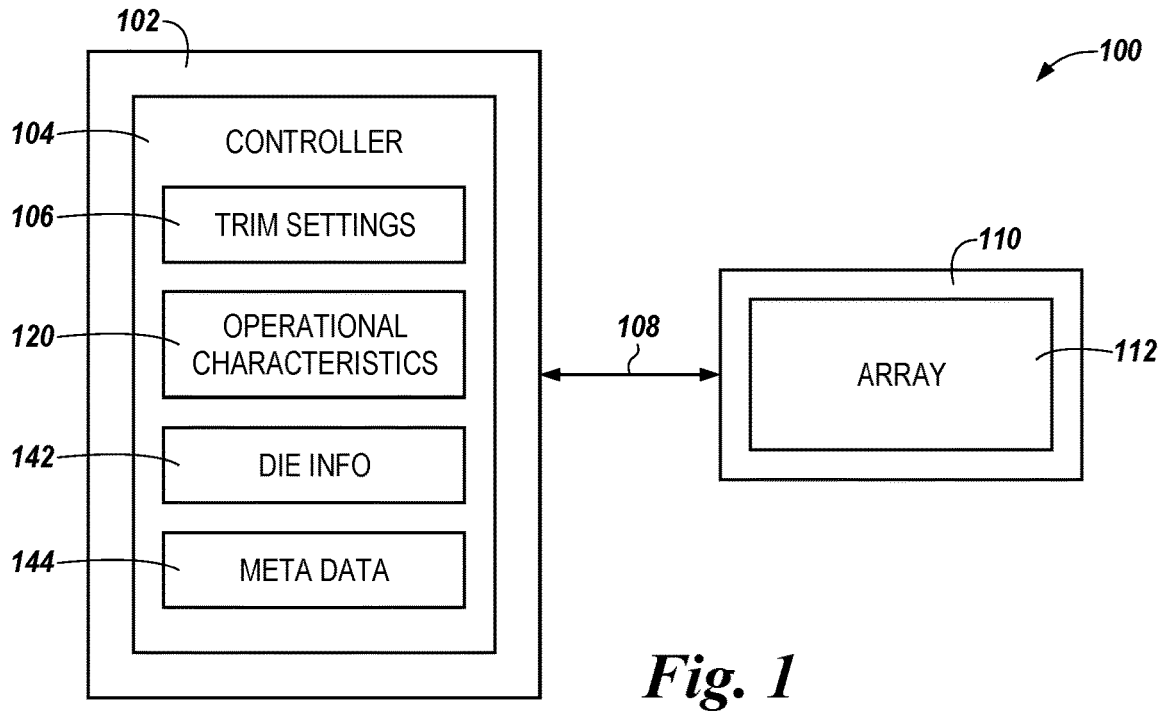
FIG. 1 is a block diagram of a system including an apparatus in the form of a computing device and an apparatus in the form of a memory device in accordance with one or more embodiments of the present disclosure.

The present disclosure includes apparatuses and methods related to determining trim settings on a memory device. An example apparatus can determine a set of trim settings for the array of memory cells based on the operational characteristics of the array of memory cells, wherein the set of trim settings are associated with desired operational characteristics for the array of memory cells.

In a number of embodiments, a field-programmable gate array (FPGA) and/or a controller can include circuitry to determine a number of trim settings for memory devices. The controller and/or FPGA can include a reconfigurable fabric that can act as an application specific integrated circuit (ASIC) to determine trim settings for the memory devices. The reconfigurable fabric can be configured in a number of different settings a number of different times to determine the trim settings for the memory devices. The trim settings can be determined as a background and/or as a foreground operation by a controller.

The FPGA and/or controller can receive monitored and/or desired operational characteristics for memory devices, die information for the arrays in memory devices, and/or metadata for the data in memory devices and use this information to determine trim settings for memory devices. FPGA and/or controller can communicate the determined trim settings to memory on a controller and the controller can store and/or send the determined trim settings to memory devices.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "M", "N", and "X", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 120 may reference element "20" in FIG. 1, and a similar element may be referenced as 220 in FIG. 2. As will be appreciated, elements shown in the various embodiments herein can be added, exchanged, and/or eliminated so as to provide a number of additional embodiments of the present disclosure.

FIG. 1 is a block diagram of a system 100 including an apparatus in the form of a computing device 102 and an apparatus in the form of a memory device 110 in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1, system 100 can include a computing device 102, with controller 104, and memory device 110. The computing device 102 and the memory device 108 can communicate via communication channel 108. Memory device 110 can include array 112, which can include volatile memory and/or non-volatile memory.

Controller 104 and/or a controller on memory device 110 can include control circuitry, e.g., hardware, firmware, and/or software. In one or more embodiments, controller 104 and/or a controller on memory device 110 can include logic and/or an application specific integrated circuit (ASIC) coupled to a printed circuit board including a physical interface. Controller 104 can include a reconfigurable fabric that can act as an application specific integrated circuit (ASIC) to determine trim settings for the memory devices. The reconfigurable fabric can be configured in a number of different settings a number of different times to determine the trim settings for the memory devices.

Memory device 110 can provide main memory for the system 100 or could be used as additional memory or storage throughout the system 100. System 100 can include memory device 110 and/or a number of memory devices, where each memory device can include one or more arrays of memory cells 112, e.g., non-volatile and/or volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and/or flash memory, among others.

The embodiment of FIG. 1 can include additional circuitry that is not illustrated so as not to obscure embodiments of the present disclosure. For example, the system 100 can include address circuitry to latch address signals provided over I/O connections through I/O circuitry. Address signals can be received and decoded by a row decoder and a column decoder to access the memory device 110. It will be appreciated by those skilled in the art that the number of address input connections can depend on the density and architecture of the memory device 110.

In a number of embodiments, controller 104 can include registers, buffers, and/or memory to store trim settings 106, operational characteristics 120 of the memory device 110, die info 142 for the array 112, and metadata 144 for the data in memory device 110. Trim settings 106 can include a number of parameters that can control the operation and performance of the memory device. For example, the trim settings can include parameters such as the programming signal magnitude (e.g., voltage and/or current level), erase signal magnitude (e.g., voltage and/or current level), sensing signal magnitude (e.g., voltage and/or current level), programming signal length, erase signal length, sensing signal length, number of bits per cells, number of programming signals in a programming operation, number of sensing signals in a sensing operation, and/or allowable programming operation rate for a memory device. Trim settings can include a number of settings for each of the number of parameters.

The trim settings can control the operational characteristics of the memory device 110. The operational characteristics of the memory device can include life span of the memory device 110, data retention characteristics for the data in the memory device 110, the storage density (e.g., the number of bits stored) for the memory device 110, disturb characteristics for the data in the memory device 110, programming speed for the memory device 110, power consumption for the memory device 110, sensing speed for the memory device 110, operation temperature for the memory device 110, and/or programming operation rate for the memory device 110, among other operational characteristics. The memory device 110 can be monitored by the controller 104 and the operational characteristics 120 of the memory device 110 stored on controller 104 can include the monitored operation characteristics. Also, the operational characteristics 120 stored on controller 104 can include desired operational characteristics. Desired operational characteristic can be input to the controller 104 from a host and/or be determined by controller 104 based on the monitored operational characteristics of memory device 110.

In a number of embodiments, trim settings 106 can include a number of configurations of trim setting parameters that can control and/or manage the operational characteristics of the memory device 110. A trim setting configuration can include setting each of the number of trim setting parameters at particular levels to provide particular operational characteristics for memory device 110. A particular trim setting configuration can be associated with particular operational characteristics for a memory device. A trim setting configuration used to operate memory device 110 can be based on monitored and/or desired operational characteristics 120 for memory device 110, die info 142 for the array 112, and/or metadata 144 for the data in memory device 110.

Trim settings 106 on controller 104 can include a look up table that includes a number of trim setting configurations. Also, trim settings 106 in controller 104 can include trim setting configurations determined by performing an algorithm that calculates trim setting configurations for memory device 110 based on monitored and/or desired operational characteristics 120 for memory device 110, die info 142 for the array 112, and/or metadata 144 for the data in memory device 110. A particular trim setting configuration of the number of trim setting configurations in trim settings 106 can be sent to memory device 110 and used by memory device 110 during operation to provide operational characteristics for memory device 110 associated with the particular trim setting configuration.

A trim setting configuration used by memory device 110 can control the operational characteristics of memory device 110 such that memory device 110 can perform with desired operational characteristics and/or closer to the desired operational characteristics than prior operational characteristics of memory device 110.

The operational characteristics of memory device 110 can be controlled by the trim setting parameters in trims settings 106. For example, the operational characteristic of life span for memory device 110 can be dependent on trim setting parameters such as the allowable programming operation rate and programming signal magnitude, for example. The life span of memory device 110 can be dependent on the allowable programming operation rate (e.g., the number of programming operations performed over a period of time) and the programming signal magnitude because a memory device has a finite number of times the memory cells of the memory device can be programmed before the memory cells fail, which in turn can be dependent on the magnitude of the programming signal used to program the memory cells. Therefore, the trim setting parameters for memory device 110 can include setting the allowable programming operation rate at a particular number of programming operations per minute to allow the memory device to have a particular life span based on prior operational characteristics of the memory device, prior trim setting configurations used by the memory device, and/or desired operational characteristics of the memory device.

Figure 2:
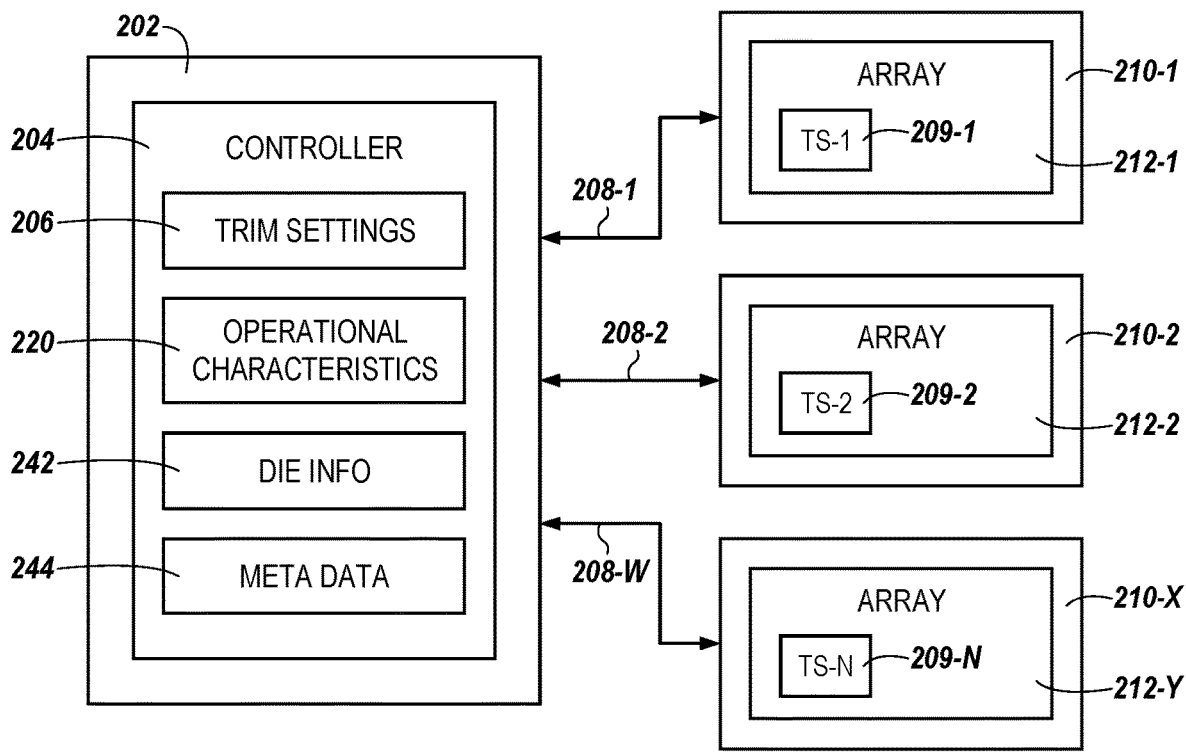
FIG. 2 is a block diagram of a system including an apparatus in the form of a computing device and a number of apparatuses in the form of memory devices in accordance with a number of embodiments of the present disclosure.

FIG. 2 is a block diagram of a system including an apparatus in the form of a computing device and a number of apparatuses in the form of memory devices in accordance with a number of embodiments of the present disclosure. Computing device 202, with controller 204, can communicate with memory device 210-1 via communication channel 208-1, memory device 210-2 via communication channel 208-2, and memory device 210-X via communication channel 208-W. Memory device can include memory array 212-1, memory device 210-2 can include memory array 212-2, and memory device 210-X can include memory array 212-Y. Memory devices 210-1, 210-2, and 210-X can include any number of memory arrays of any type of memory, such as volatile and/or non-volatile memory.

Controller 204 can include buffers, registers, and or memory to store trim settings 206 for memory devices 210-1, 210-2, and 210-X. Trim settings 206 can be configured by controller 204 based on the operational characteristics 206 memory devices 210-1, 210-2, and 210-X, the die information 242 of the arrays on of memory devices 210-1, 210-2, and 210-X, and/or the metadata for data stored on memory devices 210-1, 210-2, and 210-X. The die information 242 can include manufacturing data about the memory devices 210-1, 210-2, and 210-X, such as portions of the arrays that may be more suited for particular types of data and/or portions of the array that are less reliable. The metadata 244 for the data stored on memory devices 210-1, 210-2, and 210-X can include information such as whether the data on the memory devices is hot or cold (e.g., whether the data has been recently updated or whether the data has been on the memory device for a particular period of time).

The controller 204 can monitor memory devices 210-1, 210-2, and 210-X to determine the operational characteristics of the memory devices 210-1, 210-2, and 210-X. Also, memory devices 210-1, 210-2, and 210-X can send operational characteristics to the controller 204.

Controller 204 can send initial trim setting configurations to memory devices 210-1, 210-2, and 210-X and memory devices 210-1, 210-2, and 210-X can operation using those initial trim setting configurations. Controller can monitor memory devices 210-1, 210-2, and 210-X to determine the operational characteristics of memory devices 210-1, 210-2, and 210-X and, in turn, configure and determine new trim setting configurations that can be used to change the operational characteristics of memory devices 210-1, 210-2, and 210-X.

Controller 204 can configure the trim settings so that memory devices 210-1, 210-2, and 210-X will operate with desired operational characteristics or change their operational characteristics to be closer to the desired operational characteristics. The desired operational characteristics 220 can be based upon the type of data stored on memory devices 210-1, 210-2, and 210-X and/or the environment where memory devices 210-1, 210-2, and 210-X. The desired operational characteristics 220 can be determined by controller 204 based on monitored operational characteristics 220 and/or based on input from a host.

In FIG. 2, trim setting 1 (TS-1) 209-1 can be sent to memory device 210-1, trim setting 2 (TS-2) 209-2 can be sent to memory device 209-2, and trim setting N (TS-N) 209-N can be sent to memory device 210-X. Trim setting 1 209-1 can be configured for memory device 209-1 by controller 204 based on prior operational characteristics of memory device 209-1 monitored by controller 204. Trim setting 2 209-2 can be configured for memory device 209-2 by controller 204 based on prior operational characteristics of memory device 209-2 monitored by controller 204. Trim setting N 209-N can be configured for memory device 209-N by controller 204 based on prior operational characteristics of memory device 209-N monitored by controller 204.

Figure 3:
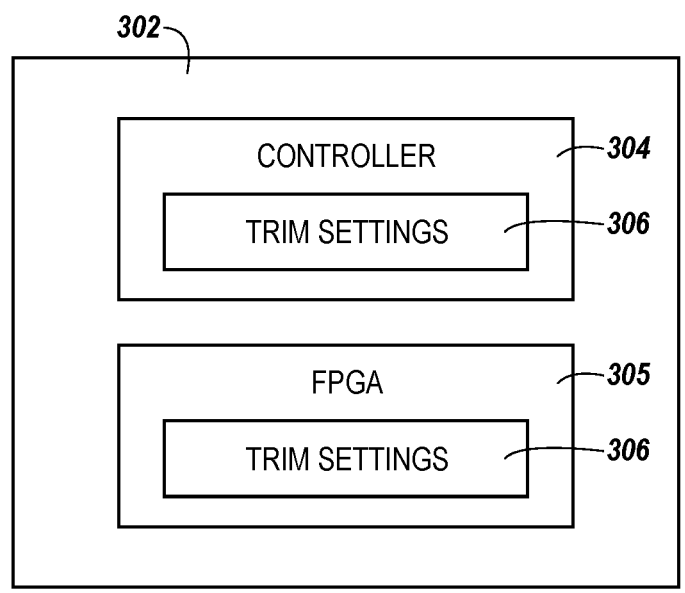
FIG. 3 is a block diagram of a computing device including an apparatus in the form a controller and an apparatus in the form of a field-programmable gate array (FPGA) in accordance with a number of embodiments of the present disclosure.

FIG. 3 is a block diagram of a computing device 302 including an apparatus in the form a controller 304 and an apparatus in the form of a field-programmable gate array (FPGA) 305 in accordance with a number of embodiments of the present disclosure. In a number of embodiments, a controller can include circuitry to determine a number of trim settings 306 for memory devices. The trim settings can be determined as a background operation by controller 304 (e.g., when the controller is not performing read, write, and/or erase operations on memory devices). The trim settings can be determined as a foreground operation by controller 304 (e.g., while the controller is performing read, write, and/or erase operations on memory devices). Controller 304 can include circuitry where a portion of the circuitry can be used to perform read, write, and/or erase operations on memory devices while another portion of the circuitry is used to determine trim settings 306 for memory device.

In a number of embodiments, a controller can include a field-programmable gate array (FPGA) 305 to determine a number of trim settings 306 for memory devices. FPGA 305 can include a reconfigurable fabric that can act as an application specific integrated circuit (ASIC) to determine trim settings for the memory devices. The reconfigurable fabric can be configured in a number of different settings a number of different times to determine the trim settings for the memory devices. FPGA 305 can receive monitored and/or desired operational characteristics for memory devices, die information for the arrays in memory devices, and/or metadata for the data in memory devices and use this information to determine trim settings for memory devices. FPGA 305 can determine a number of trim setting 306 for memory devices while controller 304 can be used to perform read, write, and/or erase operations on memory devices. FPGA 305 can communicate the determined trim settings to the controller 304 and controller 304 can store and/or send the determined trim settings to memory devices.

Figure 4:
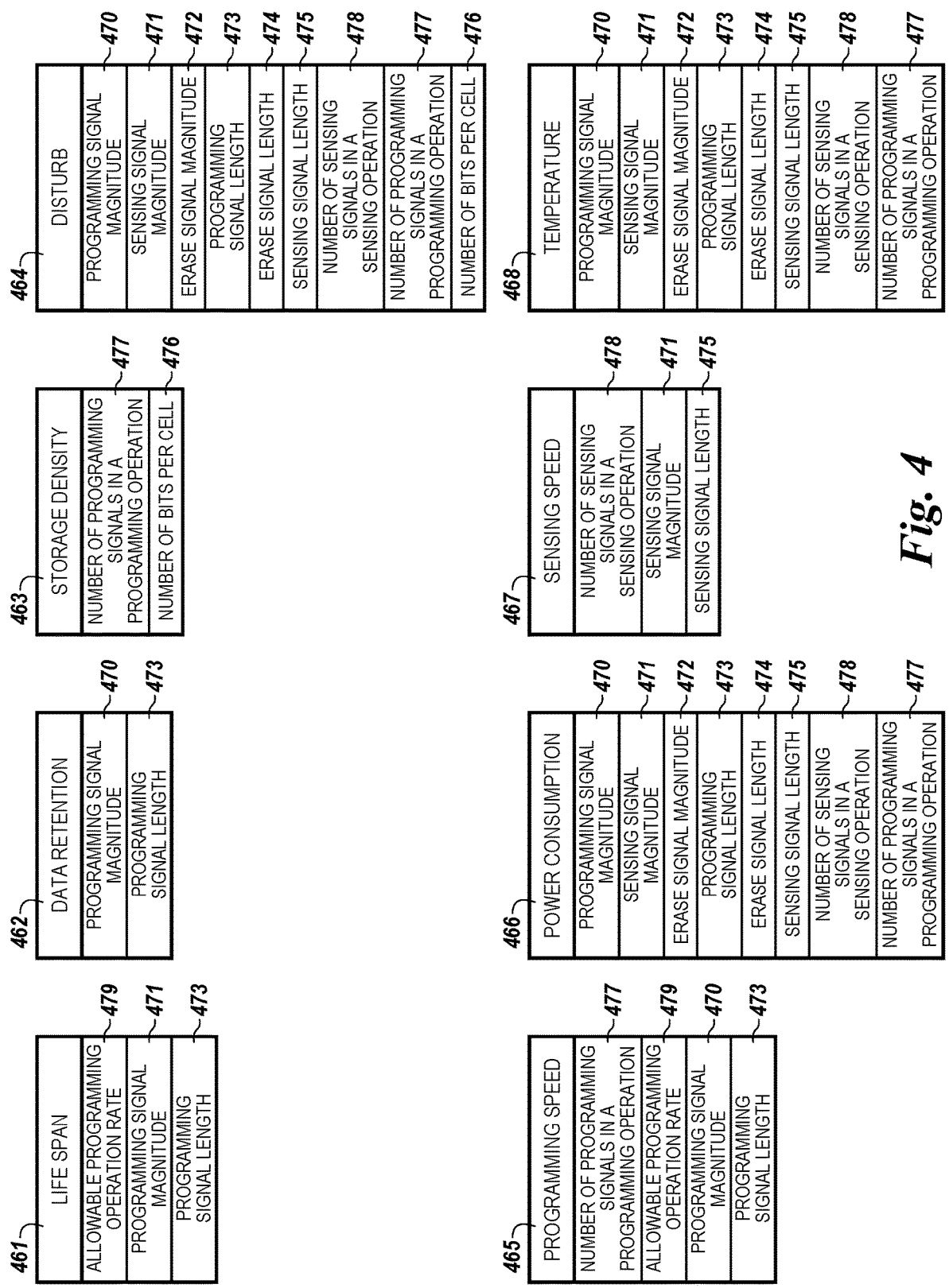
FIG. 4 is a diagram including tables with trim setting parameters associated with operational characteristics of a memory device in accordance with a number of embodiments of the present disclosure.

FIG. 4 is a diagram including tables with trim setting parameters associated with operational characteristics of a memory device in accordance with a number of embodiments of the present disclosure. In FIG. 4, the operational characteristics of a memory device include life span 461, data retention 462, storage density 463, disturb characteristics 464, programming speed 465, power consumption 466, sensing speed 467, and temperature 468. The operational characteristics in FIG. 4, among other operational characteristics, can be affected and/or controlled by trim setting parameters. In FIG. 4, the trim setting parameters associated with operational characteristics of a memory device include programming signal magnitude 470, sensing signal magnitude 471, erase signal magnitude 472, programming signal length 473, erase signal length 474, sensing signal length 475, number of bits per cell 476, number of programming signals in a programming operation 477, number of sensing signals in a sensing operation 478, and allowable programming operation rate 479. Embodiments of the present disclosure are not limited to the trim setting parameters in FIG. 4 and can include other trim setting parameters that are associated with operational characteristics of a memory device.

In FIG. 4, life span 461 of a memory device can be associated with the allowable programming operation rate 479, the programming signal magnitude 471, and programming signal length. Memory cells of memory devices can be programmed a finite number of times before they will fail. The number of times memory cells can be programmed is also associated with the magnitude and duration of the programming signals used to the program the memory cells. Trim setting configurations can include setting an allowable programming operation rate 479, along with the programming signal magnitude 471 and programming signal length to affect the life span 461 of the memory device.

In FIG. 4, data retention 462 in a memory device can be associated with the programming signal magnitude 471 and programming signal length. Data retention 462 in a memory device is the length of time after memory cells are programmed that bits of data stored in memory cells can be read without error. The magnitude of the programming signal and the length that the programming signal is applied to the memory cells can affect the data retention 462 characteristics of a memory device. For example, the voltage of the programming signal can be a particular magnitude such that the memory cell can be read over a period time despite voltage drift and/or disturb affecting reading of the data in the memory cells. Also, the length of the programming signal can be associated ensuring that programming operations are programming memory cells to the desired voltage to have desired data retention characteristics. Trim setting configurations can include setting the programming signal magnitude 471 and programming signal length 473 to affect data retention 462 characteristics in a memory device.

In FIG. 4, storage density 463 of a memory device can be associated with the number of bits per cell 476 and the number of programming signals in a programming operation 477. Storage density 463 of a memory device can include the number of bits stored per memory cell. A first portion of a memory device can store a first number of bits per memory cell and a second portion of a memory device can store a second number of bits per memory cell. Trim setting configurations that include setting the storage density 463 of a memory device can affect the programming speed of a memory device, the amount of data that can be stored on a memory device, and/or the power consumption of memory device, among other operational characteristics of a memory device. A memory device can include trim setting configurations that include the number of bits per memory cell 476 and the number of programming signals in a programming operation 477 to affect the storage density 463 of a memory device.

In FIG. 4, disturb 464 characteristics of a memory device can be associated with programming signal magnitude 470, sensing signal magnitude 471, erase signal magnitude 472, programming signal length 473, erase signal length, 474, sensing signal length 475, number of sensing signals in a sensing operation 478, number of programming signals in a programming operation 477, and number of bits per memory cell 476. Memory cells can be affected by other memory cells in a memory device. For example, the voltage of memory cell and how it was programmed to that voltage can affect the voltage of other memory cells. Also, how memory cells are sense and/or erased can affect the voltage of other memory cells. The effects of memory cells on each other in memory devices can be referred to as disturb characteristics 464 of the memory device due memory cells disturbing other memory cells. A memory device can include trim setting configurations that include the programming signal magnitude 470, the sensing signal magnitude 471, the erase signal magnitude 472, the programming signal length 473, the erase signal length, 474, the sensing signal length 475, the number of sensing signals in a sensing operation 478, the number of programming signals in a programming operation 477, and the number of bits per memory cell 476 of a memory device to affect the disturb 464 characteristics of a memory device.

In FIG. 4, programming speed 465 of a memory device can be associated with the number of programming signals in a programming operation 477, allowable programming operation rate 479, programming signal magnitude 470, and the programming signal length 473. Trim setting configurations that include setting the programming speed 465 of a memory device can affect data retention in a memory device, the life span of a memory device, and/or the power consumption of memory device, among other operational characteristics of a memory device. A memory device can include trim setting configurations that include the number of programming signals in a programming operation 477, the allowable programming operation rate 479, the programming signal magnitude 470, and the programming signal length 473 to affect the programming speed 465 of a memory device.

In FIG. 4, power consumption 466 of a memory device can be associated with programming signal magnitude 470, sensing signal magnitude 471, erase signal magnitude 472, programming signal length 473, erase signal length, 474, sensing signal length 475, number of sensing signals in a sensing operation 478, and number of programming signals in a programming operation 477. Power consumption of 466 of a memory device can be affected by the voltage level that is being used to program, erase, and sense the memory cells, along with the duration and number of signals that are being used to program, erase, and sense the memory cells. A memory device can include trim setting configurations that include the programming signal magnitude 470, the sensing signal magnitude 471, the erase signal magnitude 472, the programming signal length 473, the erase signal length 474, the sensing signal length 475, the number of sensing signals in a sensing operation 478, the number of programming signals in a programming operation 477, of a memory device to affect the power consumption 466 of a memory device.

In FIG. 4, sensing speed 467 of a memory device can be associated with the number of sensing signals in a sensing operation 478, the sensing signal magnitude 471, and the sensing signal length 475. Trim setting configurations that include setting the sensing speed 467 of a memory device can affect the latency associated with performing read operations on a memory device. A memory device can include trim setting configurations that include the number of sensing signals in a sensing operation 478, the sensing signal magnitude 471, and the sensing signal length 475 to affect the sensing speed 467 of a memory device.

In FIG. 4, the temperature 468 of a memory device can be associated with programming signal magnitude 470, sensing signal magnitude 471, erase signal magnitude 472, programming signal length 473, erase signal length, 474, sensing signal length 475, number of sensing signals in a sensing operation 478, and number of programming signals in a programming operation 477. Memory cells can be affected by the temperature of memory device. For example, the temperature of memory device when memory cells are programmed and/or read can affect the signals used to program, erase, and sense the memory cells. Also, temperature of a memory device when data is programmed and/or read can affect data retention characteristics, the programming speed, sensing speed, power consumption, and life span of a memory device. A memory device can include trim setting configurations that include the programming signal magnitude 470, the sensing signal magnitude 471, the erase signal magnitude 472, the programming signal length 473, the erase signal length, 474, the sensing signal length 475, the number of sensing signals in a sensing operation 478, and the number of programming signals in a programming operation 477 of a memory device to account for the temperature 468 of a memory device.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    an array of memory cells; and
    a controller, wherein the controller is coupled to the array of memory cells and includes a field-programmable gate array (FPGA) configured to:
        operate the array of memory cells using an initial set of trim settings, wherein the initial set of trim settings are configured to provide operational characteristics for the memory device;
        monitor operational characteristics of the array of memory cells; and
        determine another set of trim settings for the array of memory cells based on the monitored operational characteristics of the array of memory cells, meta data associated with the data stored in the array of memory cells, and die information associated with the array of memory cells, wherein the determined set of trim settings are configured to change the operational characteristics for the array of memory cells.

2. The apparatus of claim 1, wherein the controller is configured to operate the array of memory cells using the determined set of trim settings.

3. The apparatus of claim 1, wherein the determined set of trim settings are stored in the controller and sent to another array of memory cells.

4. The apparatus of claim 1, wherein the determined set of trim settings are configured to change the operational characteristics of the array of memory cells to desired operational characteristics of the array of memory cells.

5. The apparatus of claim 1, wherein the controller is configured to store the determined set of trim settings in a look up table on the controller.

6. The apparatus of claim 1, wherein the array of memory cells send operational characteristic information from the arrays of memory cells to the controller.

7. A method, comprising:
    operating a memory device using an initial set of trim settings, wherein the initial set of trim settings are configured to provide operational characteristics for the memory device;
    monitoring operational characteristics of the memory device; and
    determining another set of trim settings for the memory device based on the monitored operational characteristics of the memory device, wherein the determined set of trim settings are configured to change the operational characteristics for the memory device.

8. The method of claim 7, further including determining the another set of trim setting using a field-programmable gate array on a controller of the memory device.

9. The method of claim 7, wherein further including operating the memory device using the determined set of trim setting changes the operational characteristics of the memory device.

10. The method of claim 7, further including determining the set of trim settings based on die information for an array of memory cells in the memory device.

11. The method of claim 7, further including determining the set of trim settings based on metadata for data in the memory device.

12. The method of claim 7, wherein the method includes updating the determined set of trim settings in response to a change in the operational characteristics of the memory device.

13. A method, comprising:
    monitoring operational characteristics of a memory device when operating the memory device using an initial set of trim settings, wherein operating the memory device using the initial set of trim settings are configured to provide initial operational characteristics for the memory device; and
    configuring another set of trim settings for the memory device based on the monitored operational characteristics of the memory device, wherein the configured set of trim settings include a number of trim setting parameters and wherein the configured set of trim settings are configured to change the operational characteristics for the memory device.

14. The method of claim 13, wherein configuring the another set of trim settings includes changing the number of trim setting parameters associated with a particular operational characteristic of the memory device.

15. The method of claim 13, wherein configuring the another set of trim settings includes setting an allowable programming operation rate, a programming signal magnitude, and a programming signal length to manage a life span of the memory device.

16. The method of claim 13, wherein configuring the another set of trim settings includes setting a programming signal magnitude and a programming signal length to manage data retention characteristics of the memory device.

17. The method of claim 13, wherein configuring the another set of trim settings includes setting a number of bits per memory cell and a number of programming signals in a programming operation to manage storage density of the memory device.

18. The method of claim 13, wherein configuring the another set of trim settings includes setting a programming signal magnitude, a sensing signal magnitude, an erase signal magnitude, a programming signal length, an erase signal length, a sensing signal length, a number of sensing signals in a sensing operation, a number of programming signals in a programming operation, and a number of bits per memory cell to manage disturb characteristics of the memory device.

19. The method of claim 13, wherein configuring the another set of trim settings includes setting a number of programming signals in a programming operation, an allowable programming operation rate, a programming signal magnitude, and a programming signal length to manage a programming speed of the memory device and setting a number of sensing signals in a sensing operation, a sensing signal magnitude, a sensing signal length to manage a sensing speed of the memory device.

20. The method of claim 13, wherein configuring the another set of trim settings includes setting a programming signal magnitude, a sensing signal magnitude, an erase signal magnitude, a programming signal length, an erase signal length, a sensing signal length, a number of sensing signals in a sensing operation, a number of programming signals in a programming operation to manage power consumption of the memory device.

* * * * *